United States Patent [19]

Bender

[11] Patent Number: 4,661,786

[45] Date of Patent: Apr. 28, 1987

[54] METHOD AND APPARATUS FOR PRODUCING AN OPTICAL PHASED ARRAY

[75] Inventor: Gerald M. Bender, University City, Mo.

[73] Assignee: McDonnell Douglas Corporation, St. Louis, Mo.

[21] Appl. No.: 600,992

[22] Filed: Apr. 16, 1984

[51] Int. Cl.$^4$ ............................. H01S 3/10; H04B 9/00
[52] U.S. Cl. ..................................... 332/7.51; 330/4.3; 372/18; 350/96.13
[58] Field of Search ........................... 372/18, 33, 44; 330/4.3; 332/7.51; 350/96.13; 307/425, 428

[56] References Cited

U.S. PATENT DOCUMENTS

| | | | |
|---|---|---|---|
| 3,691,483 | 9/1972 | Klein | 330/4.3 |
| 3,727,223 | 4/1973 | O'Meara | 455/603 |
| 3,731,103 | 5/1973 | O'Meara | 332/7.51 |
| 3,764,213 | 10/1973 | O'Meara | 307/428 |
| 3,825,845 | 7/1974 | Angelbeck et al. | 332/7.51 |
| 4,163,954 | 8/1979 | Hayes | 332/7.51 |
| 4,484,144 | 11/1984 | Nagapome et al. | 330/4.3 |

Primary Examiner—Nelson Moskowitz
Attorney, Agent, or Firm—Rogers, Howell, Moore & Haferkamp

[57] ABSTRACT

A method and apparatus for producing an optical phase array includes a plurality n of phase shifters associated with a plurality n of optical signals and a number (n−1) of independent feedback loops for generating electrical correction functions which are then combined through a transformation matrix of rank (n−1) or one in which the rows are linearly independent into a plurality n of phase shift signals for driving the phase shifters. Each phase shifter has its associated phase shift signal and independently modulates its optical signal to bring all of the optical signals into phase.

34 Claims, 3 Drawing Figures

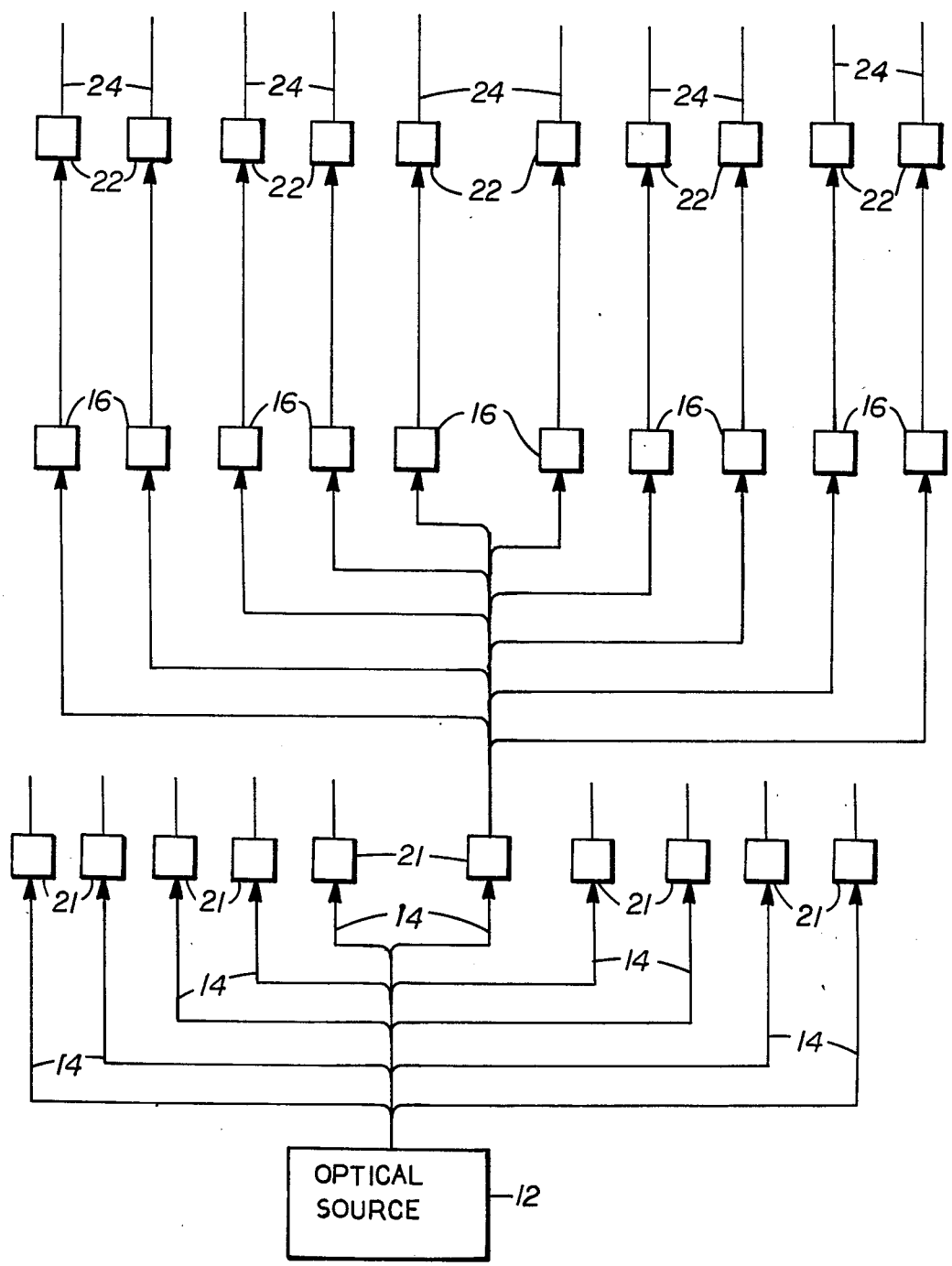

METHOD AND APPARATUS FOR PRODUCING AN OPTICAL PHASED ARRAY

BACKGROUND AND SUMMARY

Lasers have been adapted to a wide variety of applications, depending at least in part upon the power of the laser. Frequently, amplification stages are added to lasers to increase their power output, but this has deleterious effects, as known in the art. For those applications requiring a high power, single mode coherent light source, present-day single mode semi-conductor lasers cannot be scaled up to higher power levels without losing their single mode coherence. The designs presently available are all lower power devices, and hence there is a real need for a way to amplify these devices without sacrificing coherence, etc.

One approach to solving this problem is to combine several lasers in a coherent manner. It is known how to phase-lock a semi-conductor laser to a master oscillator. However, once the several lasers are in phase-lock with a single master oscillator, it is not known how to adjust the phases of the several devices so that a plane wave front is generated and the radiation is directed in only one direction.

Another approach to solving the problem has been described in a paper by D. Scifres, R. D. Burnham, W. Streifer, and M. Bernstein, and published at Appl. Phys. Lett. 41, 614 (1982). That device includes a single bar, semi-conductor laser array in which the authors claim that the device constitutes a phased array. However, the data supplied in the paper is sketchy, and there is reason to believe that the disclosed device did not operate in a single mode. Still another alternative approach is to use the spatial interference between a master array element and each other array element as the source of feedback phase information. That approach suffers two drawbacks—it is sensitive to mechanical positioning, and no practical means of implementing it is known.

The method and apparatus of the present invention produces a high power, single mode coherent light source with one or more stages of amplification, and which maintains its in-phase relationship through a number of feedback loops one less than the number of amplified optical signals. The approach utilized is to separately, individually modulate a plurality n of optical signals from a single optical source before each signal is then amplified, the modulation including shifting the phase of the individual optical signals to bring the optical signals into phase. The combined output of the amplified beam is detected, and an electrical signal corresponding thereto produced which is then filtered into a number $(n-1)$ of frequency components for electrically producing a number $(n-1)$ of phase correction functions. These phase correction functions are then combined in various combinations to produce a plurality (n) of phase shift signals to drive the separate individual modulating phase shifters which are associated with each optical signal. The relationship between the phase correction functions and the phase shift signals can be defined by a transformation matrix of $n-1 \times n$ size, and if that transformation maxtrix has a rank of $n-1$ or rows which are linearly independent, then the system of the present invention will function to maintain the separate optical signals in phase. Further, if the row vectors of the transformation matrix are mutually orthogonal, then each feedback loop exhibits the same gain and stability which further enhances the operation of the system.

It can be shown using the theory of linear transformations that it is only necessary for the system to include $n-1$ feedback loops each having a separate frequency to produce a number n of phase correction signals for modulating a number n of optical signals into phase. This technique provides several advantages in that the entire output beam is detected and used to produce the single feedback signal. This ensures the complete capture of error information and processing by the feedback loops. Additionally, a minimum number of feedback loops are used which results in a cost savings and reduces the complexity of the system. Furthermore, this basic principle can be used on any number of optical signals, the number of feedback loops always being one less than the number of processed optical signals. Therefore, as the power of an optical signal is generally limited by the power of the amplifier used, several stages of amplification can be used with a single optical source to geometrically increase the power of the beam and yet maintain all the advantages inherent with a single optical source such as coherence, etc. The apparatus and method will now be described in more detail.

The system utilizes a single optical source which is split into a plurality of optical signals by fiber conductors, each signal being processed by a modulating phase shifter and then by an individual amplifier to produce a high power, single mode coherent beam. The combined output of the amplified light souce is detected and used to produce a single electrical feedback signal. This feedback signal is filtered into a number of frequency based components, the number of frequency components being one less than the number of separately amplified optical signals, one frequency component being used in each of $n-1$ feedback loops. The component is then compared with an independently generated signal of the same frequency, the phase difference detected, and then combined with the independently generated signal of the given frequency to produce a phase correction function. Balanced output amplifiers are used to generate positive and negative phase correction functions, these positive and negative functions being combined to produce a number of phase shift signals.

The number of phase shift signals produced is equal to the number of individually amplified optical signals, and each phase shift signal is fed to a driver which in turn drives the modulating phase shifter to modulate the individual optical signal and shift its phase to bring it into phase with the other optical signals. It is noted that the relationship between the phase correction functions and the phase shift signals are defined by the electrical connections therebetween as a transformation matrix which has the property of a rank of $n-1$ or rows which are linearly independent to assure that the combined output is in phase. If connections equivalent to a transformation matrix having row vectors which are mutually orthogonal are used to combine the phase correction functions into phase shift signals, then each feedback loop should experience the same gain and stability which should further enhance the operation of the system. Of course, additional stages of amplification can be used to produce an even greater number of individual optical signals, it only being required that a modulating phase shifter be associated with each optical signal before it is amplified by the final stage of amplification.

By using the apparatus and method of the present invention, a single mode high power coherent light source can be produced.

BRIEF DESCRIPTION OF THE DRAWINGS

FIG. 2 is a block diagram of an alternative embodiment which utilizes an additional stage of amplification to geometrically increase the number of optical signals.

DETAILED DESCRIPTION OF THE PREFERRED EMBODIMENT

It should be noted that the method and apparatus of the present invention is not dependent upon the particular number of optical signals chosen, and will work with any plurality of optical signals to produce the intended results. It is believed that the greater the number of optical signals, the greater advantage will be provided by the presently disclosed apparatus and method, although that is a matter of choice for one of ordinary skill in the art.

Figure 1:
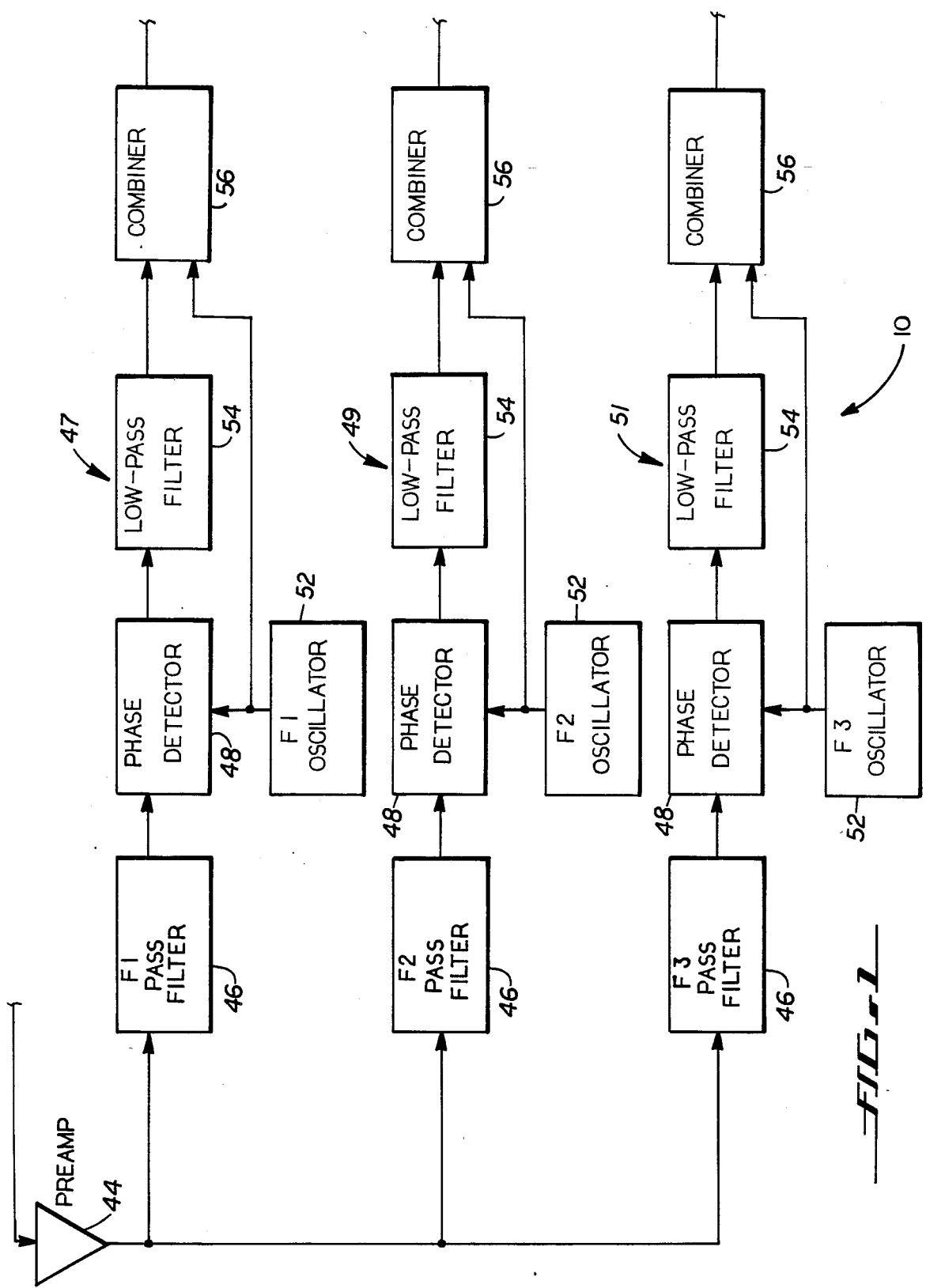
FIGS. 1 and 1A are a block diagram of the system of the present invention.
Figure 1A:
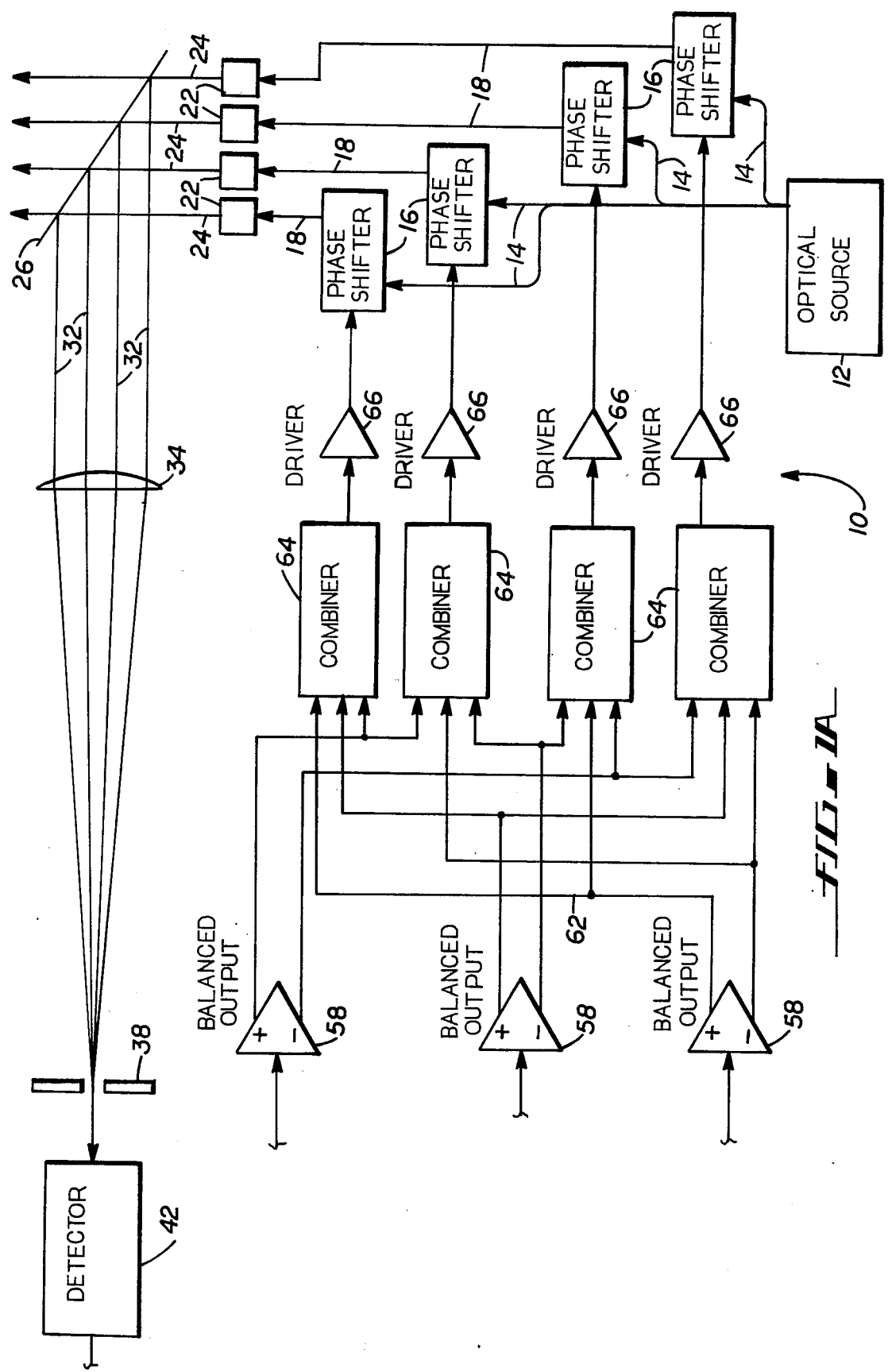

As shown in FIGS. 1 and 1A, applicant's system 10 includes a single optical source 12 which may be a Hitachi type number HLP1400 which produces a plurality of optical signals along an optical fiber 14 which may be a Valtec single mode optical fiber. Each optical fiber 14 feeds its optical signal to a phase shifter 16 which may be any of those described in the following three articles:

1. Optical Phase Modulation in an Injection Locked AlGaAs Semiconductor Laser, S. Kobayashi and T. Kimura, IEEE J. Quantum Electronics, V. QE-18, no. 10, p. 1662–1669, Oct. 1982; IEEE Trans. Microwave Th. & Tech., V. MTT-30, no. 10, p. 1650–1557, Oct. 1982;

2. Optical Phase Modulation in an Injection Locked AlGaAs Semiconductor Laser, S. Kobayashi and T. Kimura, Electron Lett., V. 18, no. 5, p. 210–211, 4 Mar. 1982; and 3. Integrated-Optical Single-Sideband Modulator and Phase Shifter, F. Heismann and R. Ulrich, IEEE J. Quantum Electronics, V. QE-18, no. 4, p. 767–771, Apr. 1982; IEEE Trans. Microwave Th. & Tech., V. MTT-30, no. 4, Apr. 1982.

The output of phase shifter 16 is transmitted by optical fiber 18 to a plurality of optical amplifiers 22 which may be any of the optical amplifiers disclosed in the following articles:

1. Noise in an AlGaAs Semiconductor Laser Amplifier, T. Mukai and Y. Yamamoto, IEEE J. Quantum Electronics, V. QE-18, no. 4, p. 564–575, Apr. 1982; IEEE Trans. Microwave Th. & Tech., V. MTT-30, no. 4, Apr. 1982;

2. Gain and Saturation Power of Resonant AlGaAs Laser Amplifier, S. Kobayashi and T. Kimura, Electron Lett., V. 16, no. 6, p. 230–232, 13 Mar. 1980;

3. Optical FM Signal Amplification and FM Noise Reduction in an Injection Locked AlGaAs Semiconductor Laser, S. Kobayashi and T. Kimura, Electron Lett., V. 17, no. 22, p. 849–851, 29 Oct. 1981;

4. Optical FM Signal Amplification by Injection Locked and Resonant Type Semi-conductor Laser Amplifiers, S. Kobayashi and T. Kimura, IEEE J. Quantum Electronics, V. QE-18, no. 4, p. 575–581, Apr. 1982; IEEE Trans. Microwave Th. & Tech., V. MTT-30, no. 4, Apr. 1982;

5. S/N and Error Rate Performance in AlGaAs Semiconductor Laser Preamplifier and Linear Repeater Systems, T. Mukai, Y. Yamamoto, and T. Kimura, IEEE J. Quantum Electronics, V. QE-18, no. 10, p. 1560–1568, Oct. 1982; IEEE Trans. Microwave Th. & Tech., V. MTT-30, no. 10, p. 1548–56, Oct. 1982; and 6. S/N Performance of an AlGaAs Laser Preamplifier and a Linear Repeater System, T. Mukai, Y. Yamamoto, and T. Kimura, Electron Lett., V. 18, no. 9, p. 382–384, 29 Apr. 1982.

The amplified output beam 24 is then transmitted through a beam splitter 26 such as a Melles Griot product number 03BTF001 which splits off a portion of the output beam 24 into a feedback beam 32 which is focused by a lens 34 such as a Melles Griot product number 01LPX445 through an aperture 38 such as a Melles Griot product number 04PIP013 to a detector 42 such as an RCA type number C30807. The aperture 38 is desirably placed in the focal plane of the lens 34 so that when the light through the aperture is maximized, the radiation at the corresponding point in the far field of the output beam 24 will also be maximized. Detector 42 senses the feedback signal and picks up all of the modulation components to the extent that they are not nulled by correct phasing through operation of the system 10.

The electrical feedback modulation signal from the detector 42 is amplified by the pre-amplifier 44 which may be a Miteq model number AU-4A-0110 and then filtered into a number of respective components by filters 46 which may be from the Wavetek Ultramin series and tuned to a pre-selected and different frequency value. As shown in the drawing, these may be conveniently labeled F1, F2, and F3. Each of these three feedback loops 47, 49, and 51 have their own oscillators 52 which may be a Vectron CO-233 series oscillator to independently generate an electrical signal of the particular frequency associated with the particular loop. Each loop also has a phase detector 48 such as a MiniCircuits model number GRA-3 to detect the difference in phase between the feedback component and the signal generated by oscillator 52. A correction signal is generated in each phase detector 48 which is then passed through a low pass filter 54 to narrow the feedback loop band width and prevent instability in the respective loop. A combiner 56 which may comprise an inductor and a capacitor, combines the correction signal and the signal from the oscillator 52 to produce a phase correction function. This signal is then input to a balanced output amplifier 58 which may be a National Semiconductor type number LM733C to produce a positive and negative phase correction function at its outputs. The outputs from the balanced output amplifiers 58 are then combined by a number of combiners 64 such as Allen-Bradley type number F14A102F as determined by the electrical connections 62. The relationship between the phase correction functions produced by balanced output amplifiers 58 and the outputs of combiners 64 may be simply represented through a transformation matrix, as is known to one of ordinary skill in the art. To ensure stability of the system 10, this transformation matrix should have rows which are linearly independent, and desirably, rows which are mutually orthogonal. If the rows are mutually orthogonal, then each feedback loop 47, 49, 51 has the same gain and stability and optimal operation is believed to be achieved.

A number of drivers 66 which may be a National Semiconductor type number LH0032C with an external input and feedback network and with a resistive bias insertion network, amplify the phase shift signals produced by combiner 64 and drive the phase shifters 16.

As shown in FIG. 2, a second level or stage of amplification may be provided to geometrically increase the number of optical signals, and thereby geometrically increase the power of the amplified output beam. As shown schematically therein, a first number of amplifiers 21 may produce a plurality, ten are shown, of amplified optical signals. Each of these ten amplified optical signals may then be further split into a plurality of optical signals for further amplification by a second stage of amplifiers 22. However, there is an intermediate stage of phase shifters 16 which are associated with the final output amplifiers to ensure that the final output is in phase. Although not shown, the other elements shown in FIGS. 1 and 1A including the detection of the output beam, and a plurality of feedback loops which are one less than the number of final output amplifiers, and the combiners and drivers for driving the phase shifter 16 are required. It is believed that all sorts of combinations can be produced which include variations of these examples. These are fully within the scope of the present invention.

There are various changes and modifications which may be made to applicant's invention as would be apparent to those skilled in the art. However, any of these changes or modifications are included in the teaching of applicant's disclosure and he intends that his invention be limited only by the scope of the claims appended hereto.

I claim:

1. A system to produce an amplified single mode coherent laser beam from a single source comprising:
a single optical source,
means to produce a plurality of optical signals from said optical source,
means to individually amplify a plurality (n) of said optical signals,
means to detect the combined outputs of said optical signals, and produce a first electrical signal corresponding thereto,
means to select (n−1) frequency components of said first electrical signal,
means to independently generate a second electrical signal at the same frequency as each of said selected frequency components,
means to detect the phase difference between each selected frequency component and its associated independently generated signal and produce a correction signal corresponding thereto,
means to combine each of said correction signals with its associated independently generated signal to produce a number (n−1) of phase correction functions,
means to combine said phase correction functions to produce a plurality (n) of phase shift signals, the transformation matrix defined by said correction function combination means having rows which are linearly independent, and
means associated with each amplified optical signal to modulate it in response to an associated phase shift signal.

2. The system of claim 1 wherein the amplification means includes more than one stage of amplification, the modulation means being associated with the last stage of amplification.

3. The system of claim 1 wherein the rows of the transformation matrix are mutually orthogonal.

4. The system of claim 1 wherein the modulation means includes means to shift the phase of the signal.

5. The system of claim 1 wherein the detection means includes means to split off a portion of the combined output, means to focus the split off portion, means to detect the intensity of the split off portion, and means to produce an electrical signal corresponding to the intensity of the split off portion.

6. The system of claim 5 wherein the focusing means includes a lens and an aperture, the aperture being positioned at the focal point of the lens.

7. The system of claim 1 wherein the frequency component selection means comprises a number (n−1) of tuned filters.

8. The system of claim 1 wherein the means to produce a plurality of optical signals includes a plurality of optical fibers connected to the single optical source, each of said fibers defining a path for an optical signal, each fiber having an associated modulation means and amplifier means.

9. The system of claim 4 further comprising a driver means associated with each phase correction function combiner means to amplify the phase shift signal, and wherein each modulation means is responsive to an associated driver means to adjust the phase of its associated optical signal.

10. A system to bring into phase a plurality (n) of amplified optical signals from a single optical source with a number (n−1) of feedback loops comprising:
means to produce a plurality (n) of amplified optical signals from a single optical source,
means to detect the combined output of said amplified optical signals and produce a number (n−1) of electrical signals corresponding thereto of different frequencies,
a number (n−1) of feedback loops to generate a number (n−1) of phase correction functions,
means to combine said phase correction functions to produce a plurality (n) of phase shift signals, the transformation matrix defined by said phase correction function combining means having rows which are linearly independent, and
means associated with each amplified optical signal to modulate it in response to an associated phase shift signal.

11. The system of claim 10 further comprising means to produce a first electrical signal corresponding to the detected combined output.

12. The system of claim 11 wherein each feedback loop includes a filter means to select an associated frequency component of said detected combined output.

13. The system of claim 12 wherein each feedback loop includes means to independently generate a second electrical signal at the same frequency as the associated frequency component, and means to detect the phase difference therebetween and produce a correction signal corresponding thereto.

14. The system of claim 13 wherein each feedback loop includes means to combine its correction signal with its independently generated second signal to produce a phase correction function.

15. The system of claim 10 wherein each phase correction function combining means includes am amplifier means associated therewith to produce both positive and negative phase correction functions, and a number (n) of combiners having multiple inputs, the outputs of said amplifier means being connected to the inputs of said combiners to define the transformation matrix.

16. The system of claim 15 further comprising a driver means associated with each combiner means to amplify the phase shift signal, and wherein the modulation means includes a phase shift means connected to each driver means and associated with an optical signal to adjust the phase of the optical signal in response to the driver means output.

17. The system of claim 10 wherein the modulation means includes means to shift the phase of its associated optical signal.

18. The system of claim 10 wherein the means to produce a plurality of optical signals includes a plurality of optical fibers connected to the single optical source, each of said fibers defining a path for an optical signal, each fiber having an associated modulation means and amplifier means.

19. The system of claim 10 wherein a separate amplifier means is associated with each optical signal to amplify same, said amplifier means processing the optical signal after it has been modulated by its associated modulation means.

20. The system of claim 10 wherein the detection means includes means to split off a portion of the combined output, means to focus the split off portion, means to detect the intensity of the split off portion, and means to produce an electrical signal corresponding to the intensity of the split off portion.

21. The system of claim 20 wherein the focusing means includes a lens and an aperture, the aperture being positioned at the focal point of the lens.

22. The system of claim 10 wherein the rows of the transformation matrix are mutually orthogonal.

23. The system of claim 10 wherein the amplified optical signal producing means includes more than one stage of amplification, the modulation means being associated with the last stage of amplification.

24. The system of claim 10 wherein each feedback loop has the same gain.

25. A system to produce an optical phased array comprising:
an optical source,
means to produce a plurality (n) of optical signals from said source, at least one stage of amplification to amplify the optical signals, and
means to modulate said optical signals in phase, said modulation means including a number of feedback loops, means to detect the combined outputs of the plurality of optical signals and produce an electrical signal corresponding thereto, means to select a frequency component of said electrical signal for each feedback loop, a plurality (n) of phase shifters, and means to combine the output of said feedback loops to produce a plurality (n) of phase shift signals to drive said plurality (n) of phase shifters.

26. The system of claim 25 wherein the number of feedback loops is n−1.

27. The system of claim 26 wherein each feedback loop has means to produce a phase correction function at least partially in response to its associated frequency component of the combined output, and wherein the means to combine said phase correction functions into a plurality n of phase shift signals defines a transformation matrix having rows which are linearly independent.

28. The system of claim 27 wherein the rows of the defined transformation matrix are mutually orthogonal.

29. The system of claim 27 wherein each feedback loop further includes means to independently generate an electrical signal of the same frequency as its associated frequency component, and a phase detector to detect the phase difference between the frequency component and the generated electrical signal.

30. The system of claim 29 wherein each feedback loop further includes means to combine the phase detector output and its associated generated electrical signal to produce the phase correction function.

31. A method of phasing an amplified optical array comprised of a plurality of amplified optical signals comprising the steps of:
individually modulating a plurality of n optical signals with a plurality of n modulating means,
individually amplifying said modulated optical signals,
detecting the combined output of said amplified modulated optical signals,
filtering the combined output into n−1 frequency components,
individually detecting the phase difference between each of the n−1 frequency components and an independently generated signal of the same frequency,
producing a phase correction function for each frequency component at least partially in response to the detected phase difference,
combining the (n−1) phase correction functions into a plurality (n) of phase shift signals, the transformation matrix relating the (n−1) phase correction functions and the (n) phase shift signals having rows which are linearly independent, and
driving the individual modulating means of each optical signal in response to an associated phase shift signal.

32. A method of phasing an amplified optical array comprised of a plurality of amplified optical signals, comprising the steps of:
individually modulating a plurality of n optical signals with a plurality of n modulating means,
individually amplifying said modulated optical signals,
detecting the combined output of said amplified optical signals,
producing a number n−1 of electrical signals corresponding to said combined output, each electrical signal having a different frequency,
generating a number n−1 of phase correction functions in a number n−1 of feedback loops,
combining said phase correction functions to produce a plurality n of phase shift signals, the transformation matrix relating the n−1 phase correction functions and the n phase shift signals having rows which are linearly independent, and
driving the individual modulating means of each optical signal in response to an associated phase shift signal.

33. A method of producing a phased optical beam from a plurality (n) of optical signals comprising the steps of:
amplifying each of the optical signals,
detecting the combined outputs of said optical signals,
producing an electrical signal corresponding thereto,
inputting a frequency component of the electrical signal into a number of feedback loops,
producing (n−1) correction functions from (n−1) feedback loops,
combining the correction functions to produce a plurality (n) of phase shift signals using a transformation matrix with rows being linearly independent to define the relationship between the correction functions and the phase shift signals, and driving a plurality (n) of phase shifters in response to the phase shift signals to modulate the optical signals into phase.

34. The method of claim 33 wherein the step of using a transformation matrix includes using a transformation matrix having rows which are mutually orthogonal.

* * * * *